United States Patent [19]

Fassett et al.

[11] 4,189,683
[45] Feb. 19, 1980

[54] SOLID STATE DIODE AMPLIFIER

[75] Inventors: Matthew Fassett, Billerica; Allen L. Hieber, Waltham; James L. Lampen, Burlington; Lawrence R. Lewis, Bedford; Jerome H. Pozgay, Needham, all of Mass.

[73] Assignee: Raytheon Company, Lexington, Mass.

[21] Appl. No.: 954,708

[22] Filed: Oct. 25, 1978

[51] Int. Cl.² ............................................. H03F 3/60
[52] U.S. Cl. ...................................... 330/287; 330/56; 330/295
[58] Field of Search ............... 330/53, 56, 124 R, 286, 330/287, 295

[56] References Cited

U.S. PATENT DOCUMENTS

| | | | |
|---|---|---|---|
| 3,974,462 | 8/1976 | Fassett | 333/22 R |
| 4,091,334 | 5/1978 | Sechi | 330/286 X |

OTHER PUBLICATIONS

Wilkinson, "An N—Way Hybrid Power Divider," *IRE Transactions on Microwave Theory and Techniques,* Jan. 1960, pp. 116–118.
*Microwaves,* "Compact Radial Power Combiner Teams Up a Dozen Power GaAs FETs," Oct. 1977, p. 9.
Lewis et al., "A Broadband Stripline Array Element," IEEE/AP-S Symposium Program and Digest, Jun. Pat. 4,189,778

*Primary Examiner*—James B. Mullins
*Attorney, Agent, or Firm*—Philip J. McFarland; Joseph D. Pannone

[57] ABSTRACT

An amplifier using a plurality of solid state diodes as the active elements is shown to comprise a plurality of amplifier channels fed, through a first radial line, by signals to be amplified and connected, through a second radial line, to a load.

3 Claims, 3 Drawing Figures

SOLID STATE DIODE AMPLIFIER

BACKGROUND OF THE INVENTION

This invention pertains generally to solid state amplifiers and in particular to amplifiers of such type which use high power IMPATT diodes and which are adapted to broadband operation.

Solid state amplifiers using devices such as IMPATT diodes with inherently high reliability, low cost, small size, light weight and low voltage requirements are now being considered for use in many radar and navigation systems. However, the low power capability of known types of IMPATT diodes (or other similar devices) in the microwave portion of the radio frequency spectrum has, heretofore, limited the application of the solid state amplifier with a single IMPATT diode to low power applications. When the particular application requires a power level higher than is possible with a single IMPATT diode, it is sometimes feasible to combine the power outputs of several IMPATT diodes to attain the requisite power level. For example, a number of IMPATT diodes may be coupled to a resonant cavity in any one of many known ways so that the outputs of such diodes are added together in phase. Unfortunately, however, the operating bandwidth of any such arrangement is determined by the bandwidth of the resonant cavity; as a result, then, if an operating bandwidth of more than a few percent of the operating frequency is required, no combining arrangement using a resonant cavity is feasible.

Other known types of power combiners include the so-called series constrained binary combiner and the N-way Wilkinson combiner, which is described in an article entitled "An N-Way Hybrid Power Divider" by E. J. Wilkinson, IRE Transactions on Microwave Theory and Techniques, January, 1960. However, any known series constrained binary combiner is large, is power limited, and is subject to relatively large insertion losses, while the Wilkinson combiner requires relatively large power dissipating isolation resistors (which are difficult to implement) to operate properly at a high power level.

Still another known type power combiner is the so-called radial line power combiner wherein there is a low loss and a high degree of symmetry. However, to be of any practical value, such a power combiner must be provided with mode suppression and isolation means. Thus, one known form of radial line power combiner (described in an article appearing on page 9 of the October 1977 issue of "MICROWAVES") employs isolation resistors between adjacent arms of the combiner. As mentioned hereinabove, such resistors tend to limit the performance of a combiner used in a high power application.

In another known radial line combiner a mode suppression arrangement is provided at each radial feed. Unfortunately, however, any known mode suppression arrangement is lossy and is subject to the shortcoming that the individual IMPATT diodes may lock together rather than to the input signal intended to be amplified.

SUMMARY OF THE INVENTION

With this background of the invention in mind, it is therefore an object of this invention to provide a broadband high power IMPATT diode amplifier.

Another object of this invention is to provide a broadband high power IMPATT diode amplifier having radial line input and output power distribution networks.

Still another object of this invention is to provide a broadband high power IMPATT diode amplifier with isolation between each feed port of the radial line output power distribution network.

These and other objects of the invention are generally attained by providing a pair of parallel plate radial lines, one for dividing the input signal to be amplified into different amplifier channels and one for combining the outputs of the different amplifier channels. Each amplifier channel is formed in stripline with coupling means to the parallel plate radial lines, a pair of three port stripline circulators, a high power load and a stripline-to-coax transition for connecting to a coaxially mounted IMPATT diode and a double tuned transformer matching section together with biasing provisions including a DC blocking capacitor and a radio frequency (RF) choke for each of the IMPATT diodes.

BRIEF DESCRIPTION OF THE DRAWINGS

Other objects and many of the attendant advantages of the invention will be readily appreciated as the same becomes better understood by reference to the following detailed description when considered in connection with the accompanying drawings wherein.

DESCRIPTION OF THE PREFERRED EMBODIMENT

Figure 1:
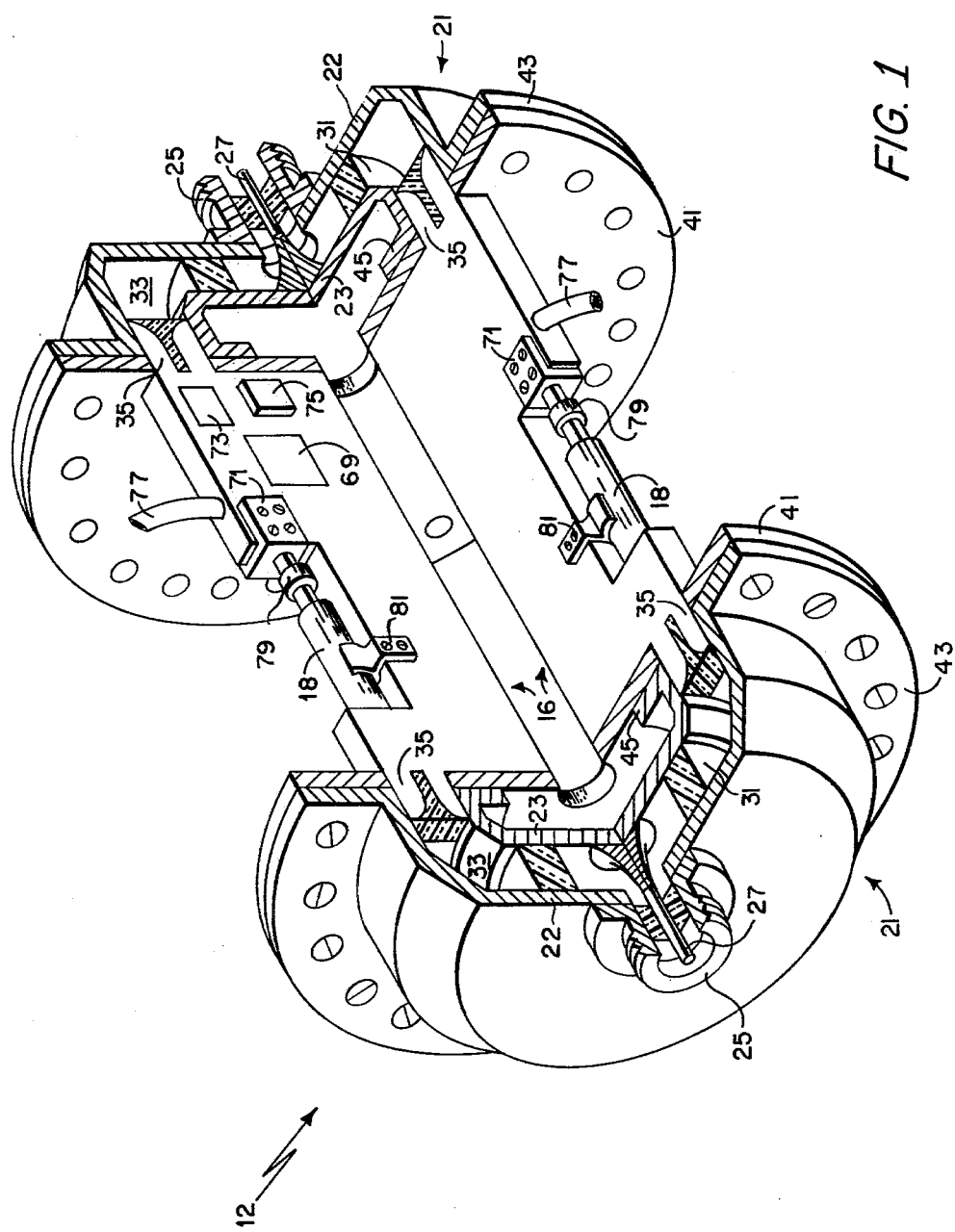
FIG. 1 is an isometric view of a broadband IMPATT diode amplifier according to this invention.

Referring now to FIG. 1, an IMPATT diode amplifier 12, as herein contemplated for use in the X-band, is shown to include a pair of parallel plate radial lines 21 (hereinafter sometimes referred to as a power divider 21) having a plurality (although only two are here shown) of diode amplifier channels 16 disposed therebetween. Each one of the diode amplifier channels is shown to include a coaxial IMPATT diode as the active element therein. In operation, an input signal, as from an exciter (not shown), applied to the power divider 21, is split, with equal portions thereof being applied to the diode amplifier channels 16. The amplified output signals from the latter are passed to the parallel plate radial line on the right of FIG. 1 wherein a relatively high power X-band output signal is produced for connection to a suitable load, as, for example, a radar antenna (not shown).

The power divider is shown to include a top plate 22 and a bottom plate 23 arranged to form a parallel plate waveguide region therebetween through which the radio frequency energy may pass. Power is introduced into the parallel plate waveguide region on the left of FIG. 1 via a coaxial connector 25 and a coax-to-waveguide transition 27, both of which are of conventional design. A dielectric ring 31 is provided within the parallel plate waveguide region to allow for pressurization should the IMPATT diode amplifier 12 be used in a high altitude environment.

The periphery of the power divider 21 is folded, as shown, to form an E-plane bend 33, which may be tuned by controlling the flare of the top and bottom plates 22, 23 respectively. Disposed within the E-plane bend 33 are a series of equally spaced, stripline flared notch radiators 35. The flared notch radiators 35, which are described in an article entitled "A Broadband Stripline Array Element" by L. R. Lewis, M. Fassett and J. Hunt, IEEE/AP-S Symposium Program and Digest, June 1974, are capable of broadband (an octave or greater) operation. The radiators 35 are formed by symmetrically etching both sides of the stripline to form smoothly tapered notches (not numbered) terminated at the maximum flare width by the edges of the stripline and by a short circuit (not numbered) at the notch bottom. The stripline center conductor (not shown) crosses the notch (not numbered) at a right angle to the flare center line and is terminated in an open circuit. Broadband match is achieved by appropriately adjusting the notch depth and the location of the center conductor open circuit.

Accurate peripheral positioning of the stripline flared notch radiators 35 is realized by means of slits (not shown) provided in an annular mounting plate 41. The latter is mounted by means of screws (not numbered) to flanges 43, 45 provided, respectively, on the top plate 22 and the bottom plate 23. The slits (not shown) are dimensioned to just provide clearance for the stripline flared notch radiators 35 and any gaps existing between the radiators 35 and the slits (not shown) are filled with a conductive epoxy (also not shown) to prevent the leakage of undesired radiation from such gaps. The stripline flared notch radiators 35 extend through the slits (not shown) so that the bottoms of the notches (not numbered) are coincident with the inner surface of the annular mounting plate 41. Thus, the stripline flared notch radiators 35 extending into the E-plane bends 33 are relatively short and, therefore, no additional support structures are required.

Figure 2A:
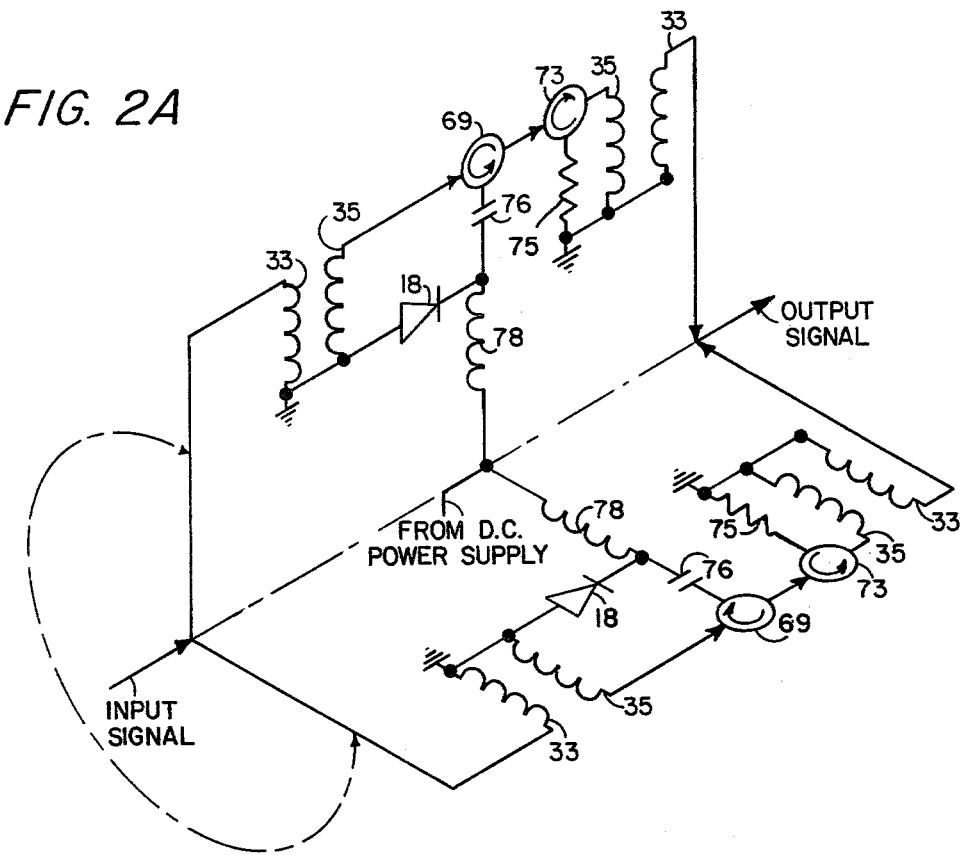
FIG. 2A is a schematic representation of the broadband amplifier of FIG. 1 useful in understanding the operation of that device.

Referring now to FIG. 2A, a schematic representation of the broadband IMPATT diode amplifier 12 (FIG. 1) is presented. Thus, an input signal is here shown to be split into two parts directed to two corresponding parts of the E-plane bends 33, here shown as the primary windings of transformers (not numbered). The corresponding stripline flared notch radiators 35, which are here shown as the secondary windings of the transformers (not numbered), couple the split portions, via three port stripline circulators 69 and DC blocking capacitors 76, to individual ones of the coaxial IMPATT diode amplifiers 18, which are here represented simply as IMPATT diodes 18. Bias voltage from a DC power supply (not shown) is passed, via RF chokes 78, to the IMPATT diodes 18, while the DC blocking capacitors 76 prevent the bias voltage from entering the three port circulators 69. The amplified signals out of IMPATT diodes 18 are passed, via the three port stripline circulators 69 and a second set of three port stripline circulators 73, to an output set of stripline flared notch radiators 35, also shown as the primary windings of a set of transformers (not numbered). The output signals from the stripline flared notch radiators 35 are coupled to the E-plane bends 33 of the output parallel plate radial line 21 (FIG. 1), here shown as the secondary windings of a set of transformers (not numbered). It is noted here in passing that the third ports of the three port stripline circulators 73 are terminated in high power stripline loads 75. The latter are described in detail in U.S. Pat. No. 3,974,462 issued Aug. 10, 1976, inventor Matthew Fassett, which is assigned to the same assignee as the present application.

The parallel plate radial lines 21 (FIG. 1) provide well defined and circularly symmetric phase fronts at the stripline flared notch radiators 35, thereby ensuring equal excitation by the split portions of the input signal. In the event of a single diode failure in any of the IMPATT diode amplifiers 18, higher order circumferential radial line modes will be generated within the parallel plate radial line 21 (FIG. 1). The effect of such modes is to produce assymmetric reflections within the parallel plate radial lines 21 (FIG. 1). Because graceful degradation of performance is desired, circulators 73 and the high power stripline loads 75 are provided in each one of the IMPATT diode amplifiers 18 to isolate the parallel plate radial lines 21 (FIG. 1) from the IMPATT diodes. The circulators 73 and the high power stripline loads 75 absorb any reflections due to higher order circumferential radial line modes, thereby maintaining the equi-phase, equi-amplitude excitation in the radial line power divider 21 (FIG. 1) even after one, or more, of the IMPATT diodes may fail.

Referring back now for a moment to FIG. 1, shown completing each one of the diode amplifier channels 16 is a bias lead 77 which is connected in a conventional manner to provide a bias voltage from a supply (not shown) to the IMPATT diodes. A stripline-to-coax adapter 71, which is here a Model No. 9108 stripline end launch pack connector manufactured by Kevlin Manufacturing Company, Woburn, Massachusetts, provides the interface between the stripline and the coaxial IMPATT diode amplifiers 18. Finally, a mounting support member 81, which is attached to the stripline in any convenient fashion, as by means of rivets (not numbered), is included to provide additional support for each one of the coaxial IMPATT diode amplifiers 18.

Figure 2B:
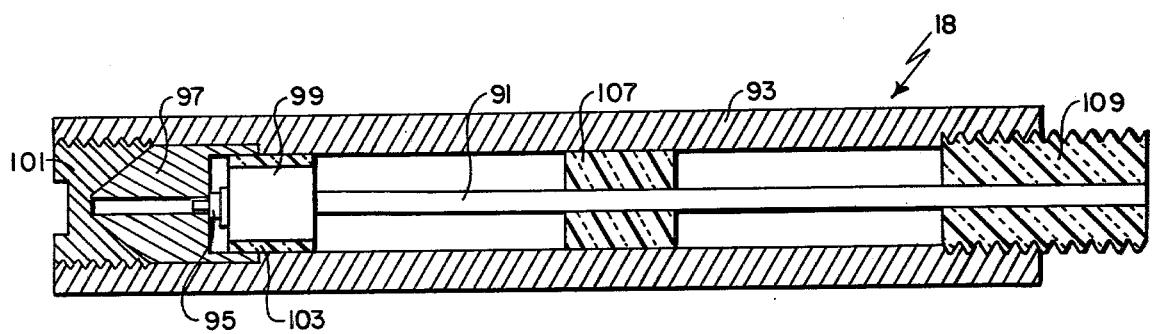
FIG. 2B is a cross-sectional view of an individual one of the coaxial IMPATT diode amplifiers used in the broadband IMPATT diode amplifier of FIG. 1.

Referring now to FIG. 2B, an exemplary one of the coaxial IMPATT diode amplifiers 18 is shown to include a center conductor 91 and an outer conductor 93 dimensioned to provide a transmission line section having a characteristic impedance of fifty ohms. The IMPATT diode 95 is mounted between a heat sink 97 which is supported by the outer conductor 93 and a shoulder 99 formed on the inner conductor 91. The IMPATT diode 95 is maintained in position by bonding with a conductive epoxy to the shoulder 99 and by soldering to a hole (not numbered) provided in the heat sink 97. The latter is held in place by a threaded member 101.

An insulating sleeve 103 is disposed, as shown, to isolate the heat sink 97 and the outer conductor 93 from the shoulder 99. A first impedance transformer (not numbered) here made up of the shoulder 99 and the insulating sleeve 103 is disposed, as shown, adjacent to the IMPATT diode 95. A second impedance transformer (not numbered), here comprising a dielectric sleeve 107 slidably disposed within the outer conductor 93, is also emplaced, as shown. The first impedance transformer (not numbered) is used to match the relatively low impedance of the IMPATT diode 95 to the fifty ohm characteristic impedance of the transmission line section. It will be appreciated by those of skill in the art that in order to realize maximum gain from a stable amplifier over the greatest possible bandwidth the reactance of the matching structure should decrease with increasing frequency through the requisite bandwidth. The second impedance transformer (also not numbered), in conjunction with the first impedance transformer, provides such a characteristic. The second impedance transformer (not numbered) whose position relative to the IMPATT diode 95 may be controlled through a slit (not shown) in the outer conductor 93 also compensates for variations between different ones of the IMPATT diodes 95.

The center conductor 91 is shown to be terminated by a jack-to-jack coaxial connector 109 threaded into the outer conductor 93. The connector 109, which is here a Model 2098-5787 from American Microwave Industries, Inc., Waltham, Massachusetts, is designed to interface with the center conductor 91. Thus, for impedance matching purposes, a dielectric insert (not shown) within the connector 109 is flush with the shell (not numbered) of the connector 109 on the end that mates with the center conductor 91.

In operation each of the coaxial IMPATT diode amplifiers 18 is pretuned individually before being attached to a broadband IMPATT diode amplifier channel 12 (FIG. 1). It will be appreciated that, to make the connection between the coaxial IMPATT diode amplifier 18 and the stripline-to-coax jack 71 (FIG. 1), a plug-to-plug adapter 79 (FIG. 1) is required. Such a combination provides a convenient transition (from the point of view of impedance match) between each coaxial IMPATT diode amplifier 18 and the corresponding diode amplifier channel 16.

Having described a preferred embodiment of this invention, it will be appreciated by one of skill in the art that changes may be made without departing from the concept of amplifying signals by coupling, via radial lines, to and from a plurality of amplifier channels using IMPATT diodes as the active elements. For example, other types of solid state diodes may be used or the number of amplifier channels may be changed. It is felt, therefore, that this invention should not be restricted to its disclosed embodiment, but rather should be limited only by the spirit and scope of the appended claims.

What is claimed is:
1. An amplifier for radio frequency signals comprising:
   (a) a first and a second radial line, each having an E-plane bend formed in the peripheral portion thereof and centrally disposed means for connecting a signal to be amplified to the first radial line and an amplified signal to a load; and
   (b) a plurality of like amplifier channels radially disposed between the first and the second radial line, each one of such amplifier channels being coupled to the first and the second radial lines adjacent to the E-plane bend in such lines and incorporating a solid state diode as the active element.
2. The amplifier as in claim 1 wherein each amplifier channel comprises:
   (a) stripline circuitry having a first and a second flared notched radiators formed therein, the first one of such radiators being coupled to the first radial line and the second one of such radiators being coupled to the second radial line; and
   (b) and IMPATT diode and a first circulator coupled to the stripline circuitry.
3. Tha amplifier as in claim 2 having, additionally:
   (a) a second circulator disposed in the stripline circuitry between the first circulator and the second flared notch radiator, such second circulator being effective to permit radio frequency energy to flow from the first circulator to the second flared notch radiator and to direct radio frequency energy flowing from the second flared notch radiator to a path separated from the path between the first circulator and the flared notch radiator; and
   (b) a dissipative load disposed in the path.

* * * * *